(12) United States Patent
Schamberger et al.

(10) Patent No.: US 6,418,069 B2
(45) Date of Patent: Jul. 9, 2002

(54) METHOD OF REPAIRING DEFECTIVE MEMORY CELLS OF AN INTEGRATED MEMORY

(75) Inventors: Florian Schamberger, Bad Reichenhall; Helmut Schneider, München, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/793,789

(22) Filed: Feb. 26, 2001

Related U.S. Application Data

(63) Continuation of application No. PCT/DE99/02571, filed on Aug. 17, 1999.

(30) Foreign Application Priority Data

Aug. 26, 1998 (DE) .......................................... 198 38 861

(51) Int. Cl.[7] .................................................. G11C 7/00
(52) U.S. Cl. ....................................... 365/200; 365/201
(58) Field of Search ........................... 365/200, 185.09, 365/201; 714/711

(56) References Cited

U.S. PATENT DOCUMENTS

| | | | |
|---|---|---|---|
| 4,586,178 A | 4/1986 | Bosse ........................... | 371/10 |
| 5,206,583 A | 4/1993 | Dawson et al. .............. | 324/158 |
| 5,410,687 A | 4/1995 | Fujisaki et al. ............. | 395/575 |
| 6,026,505 A * | 2/2000 | Hedberg ...................... | 714/711 |

FOREIGN PATENT DOCUMENTS

| | | |
|---|---|---|
| DE | 196 12 407 A1 | 11/1996 |
| DE | 197 36 250 A1 | 2/1998 |
| DE | 197 25 581 C2 | 1/1999 |
| EP | 0 140 595 A2 | 5/1985 |
| FR | 2 699 301 A1 | 6/1994 |

OTHER PUBLICATIONS

Y. Nishimura et al.: "Redundancy test for 1 Mbit DRAM using Multi–Bit–Test Mode", IEEE 1986 International Test Conference, paper 22.4, pp. 826–829.
John R. Day: "A Fault–Driven, Comprehensive Redundancy Algorithm", IEEE Design and Test, Jun. 1985, No. 3, pp. 35–44.
Gene P. Bosse: "High Speed Redundancy Processor", IEEE International Test Conference, paper 9.4, pp. 282–286.

* cited by examiner

*Primary Examiner*—A. Zarabian
(74) *Attorney, Agent, or Firm*—Laurence A. Greenberg; Werner H. Stemer; Ralph E. Locher

(57) ABSTRACT

The memory cells of an integrated memory are successively tested and immediately following the detection of a defect of the memory cell currently being tested, the affected row line or column line is replaced by programming one of the redundant lines. After a certain number of the redundant lines have been programmed, the programming of at least one of the redundant lines is canceled if a further defect is found. This redundant line is programmed for repairing a defect of another memory cell.

5 Claims, 5 Drawing Sheets

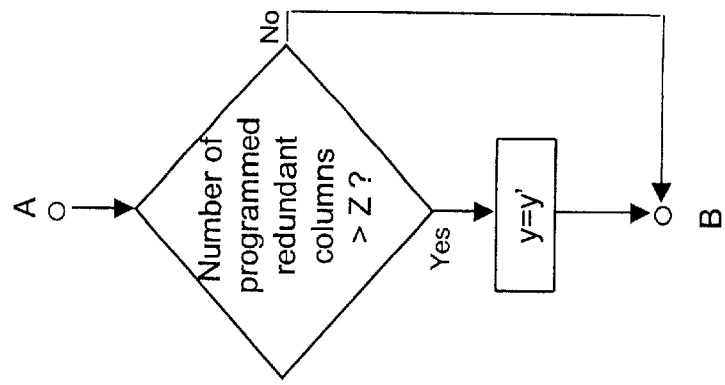
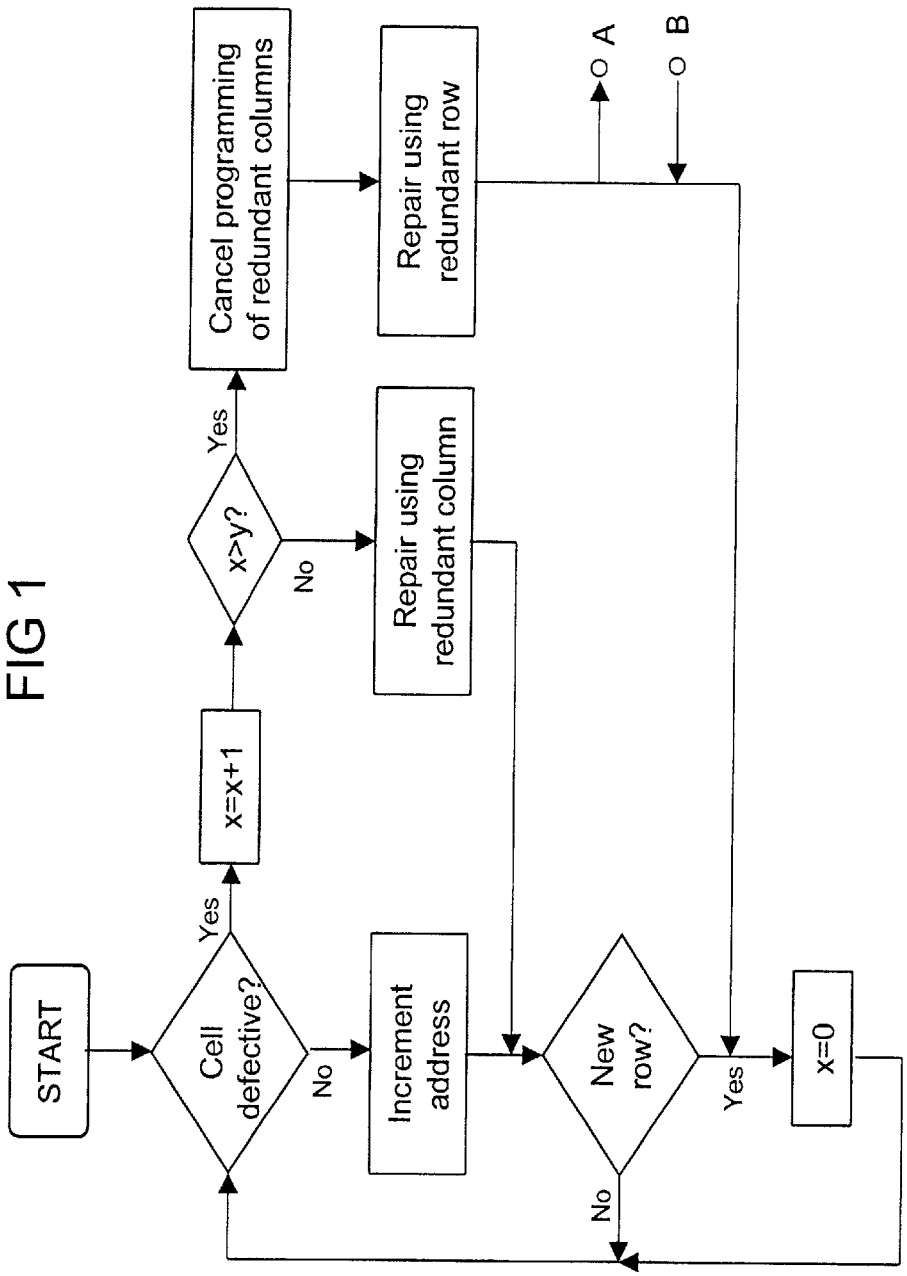

METHOD OF REPAIRING DEFECTIVE MEMORY CELLS OF AN INTEGRATED MEMORY

CROSS-REFERENCE TO RELATED APPLICATION

This application is a continuation of copending International Application PCT/DE99/02571, filed Aug. 17, 1999, which designated the United States.

BACKGROUND OF THE INVENTION

Field of the Invention

The invention lies in the integrated technology field and relates, more specifically, to a method for repairing defective memory cells of an integrated memory.

Such a method is described in U.S. Pat. No. 5,410,687. There, individual memory cells of a memory are tested which are located at cross points of rows and columns. The memory has, for each column and each row, an error counter in which the errors detected for this column or row, respectively, are added together. After all memory cells have been checked, a repair of defective memory cells is effected by means of redundant column and row lines on the basis of the information stored in the error counters. The method described has the disadvantage that the error counters needed for its execution require a relatively large space.

U.S. Pat. No. 5,206,583 describes an integrated circuit which has separable connections (fuses) for a permanent programming of redundant elements. The integrated circuit also has reversibly programmable elements in the form of latches which are connected in parallel with the fuses and which are used for testing the reversible programming of the redundant elements.

SUMMARY OF THE INVENTION

The object of the present invention is to provide a method of repairing defective memory cells of an integrated memory device which overcomes the above-noted deficiencies and disadvantages of the prior art devices and methods of this general kind, and wherein the necessary hardware components require the smallest possible area.

With the above and other objects in view there is provided, in accordance with the invention, a method of repairing defective memory cells of an integrated memory. The memory has memory cells arranged at cross points of row lines and column lines and reversibly programmable redundant lines including redundant row lines and redundant column lines. The method comprises the steps of:

successively testing the memory cells;

immediately upon detecting a defect of a memory cell being tested, replacing the respectively affected row line or column line by programming one of the redundant lines;

after a certain number of the redundant lines have been programmed, canceling a programming of a given one of the redundant lines upon detecting a further defect; and programming the given redundant line for repairing a defect of another memory cell.

In other words, according to the novel testing method, the memory cells are successively checked. Immediately following the detection of a defect of the memory cell checked in each case, the row line affected or the column line affected is replaced by programming one of the redundant lines. After a certain number of the redundant lines has been programmed, the programming of at least one redundant line is canceled when a further defect is detected, and this redundant line is programmed for repairing a defect of another memory cell.

The column lines can be, for example, bit lines and the row lines can be, for example, word lines of the integrated memory. In other exemplary embodiments, the column lines can also be word lines and the word lines can be bit lines of the memory.

The method has the advantage that (in contrast with the above-noted U.S. Pat. No. 5,410,687) no error counters are required for each column line and row line to be checked since a defect is in each case repaired immediately after it has been detected. To achieve a certain optimization of the repair to be carried out, nevertheless, the programming of at least one of the redundant lines is canceled in dependence on the number of redundant lines already programmed previously so that this redundant line can then be used to repair a defect found later.

The reversible programming of the redundant lines can be done, for example, by means of reversibly programmable elements such as the latches described in U.S. Pat. No. 5,206,583. The repair method according to the invention is distinguished by an extremely small hardware expenditure so that it is particularly suitable for implementing a self-test and a self repair of the integrated memory to be repaired. This means that all components required for carrying out the repair method are components of the integrated memory or, respectively, are arranged in the same integrated circuit together with this memory. On the other hand, naturally, the method according to the invention can also be implemented in software or can also be performed by an external tester of the integrated memory.

In accordance with an added feature of the invention:

the memory cells are tested for defects row by row;

upon finding a defect of the memory cell being tested, the affected column line is replaced with one of the redundant column lines if a number of the programmed redundant column lines does not exceed a threshold value;

if the threshold value is exceeded, any programming of redundant column lines which has taken place due to defects having been found in the affected row line is canceled; and the affected row line is replaced with one of the redundant row lines.

In accordance with an additional feature of the invention, the threshold value, i.e., the limit value for the number of redundant column lines to be programmed, is changed during the checking. This provides for an adaptation to the number of redundant column lines not yet programmed which still exists.

According to this first embodiment of the repair method, the memory cells are checked for defects row by row and, when a defect of the memory cell just checked is detected, the column line affected is replaced by a redundant column line if the number of programmed redundant column lines does not then exceed a limit value. When the limit value is exceeded, any programming of redundant column lines which has taken place on the basis of defects detected in the row line affected are canceled and the row line affected is replaced by one of the redundant row lines.

In this embodiment, a repair of detected defects in each case takes place perpendicularly to the direction of testing. This is because testing takes place row by row and replacement initially takes place column by column. It is only when the number of the redundant column lines already used exceeds the limit value that the preceding programming operations are at least partially canceled. However, it is only the programming operations of those redundant column lines which have been programmed on the basis of defects recognized in the relevant row line which are being canceled. Since the row line affected is then replaced by a redundant row line and the programming of redundant column lines which has taken place on the basis of row lines previously tested is not canceled, all defects detected are repaired in the manner described within a single test run through the memory cells if there are sufficient redundant lines.

In accordance with an alternative feature of the invention, the novel method provides for the following steps:

testing the memory cells, beginning at a start address;

once all redundant lines have been programmed, canceling the programming of one of the redundant lines if a further defect is found;

retesting the memory cells, beginning at the start address;

if, during the retesting step, a defect is found, with an address before the further defect, reversing the canceling of the programming of the corresponding redundant line;

subsequently repeating the three preceding method steps with respect to the step of canceling the programming of another one of the redundant lines;

if, after canceling the programming of one of the redundant lines, during the subsequent testing of the memory cells, no defect is found with an address before the further defect, repairing the further defect with the redundant line that has become available due to the canceling of its programming.

In other words, the memory cells are tested beginning with a start address. Once all redundant lines have been programmed, the programming of one of the redundant lines is canceled when another defect is detected. The memory cells are then tested again beginning with the start address. If then a defect is detected, the address of which is arranged before the further defect, the cancellation of the programming of the corresponding redundant line is reversed. This means that the corresponding redundant line is programmed to replace the same normal line as before the cancellation of its programming. After that, the three preceding method steps are repeated with respect to the cancellation of the programming of another one of the redundant lines. If, after the cancellation of the programming of one of the redundant lines, no defect with an address arranged before the further defect is detected during the subsequent testing of the memory cells, it is repaired with the redundant line which has become free due to the cancellation of its programming.

This embodiment of the invention provides for the cancellation of the programming of those redundant lines which only repair defects which have already been detected and which, in addition, have already been eliminated by other redundant lines. These defects, therefore, stay repaired after the programming of the relevant redundant line has been canceled.

In accordance with a concomitant feature of the invention, the memory is marked unrepairable if, after the further defect has been found, the successive canceling of the programming of all redundant lines does not provide for a repair of all the detected defects.

Other features which are considered as characteristic for the invention are set forth in the appended claims.

Although the invention is illustrated and described herein as embodied in a method for repairing defective memory cells of an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a flowchart of a first embodiment of the repair method according to the invention;

FIG. 2 is a supplement to the flowchart of FIG. 1;

DESCRIPTION OF THE PREFERRED EMBODIMENTS

Figure 3:
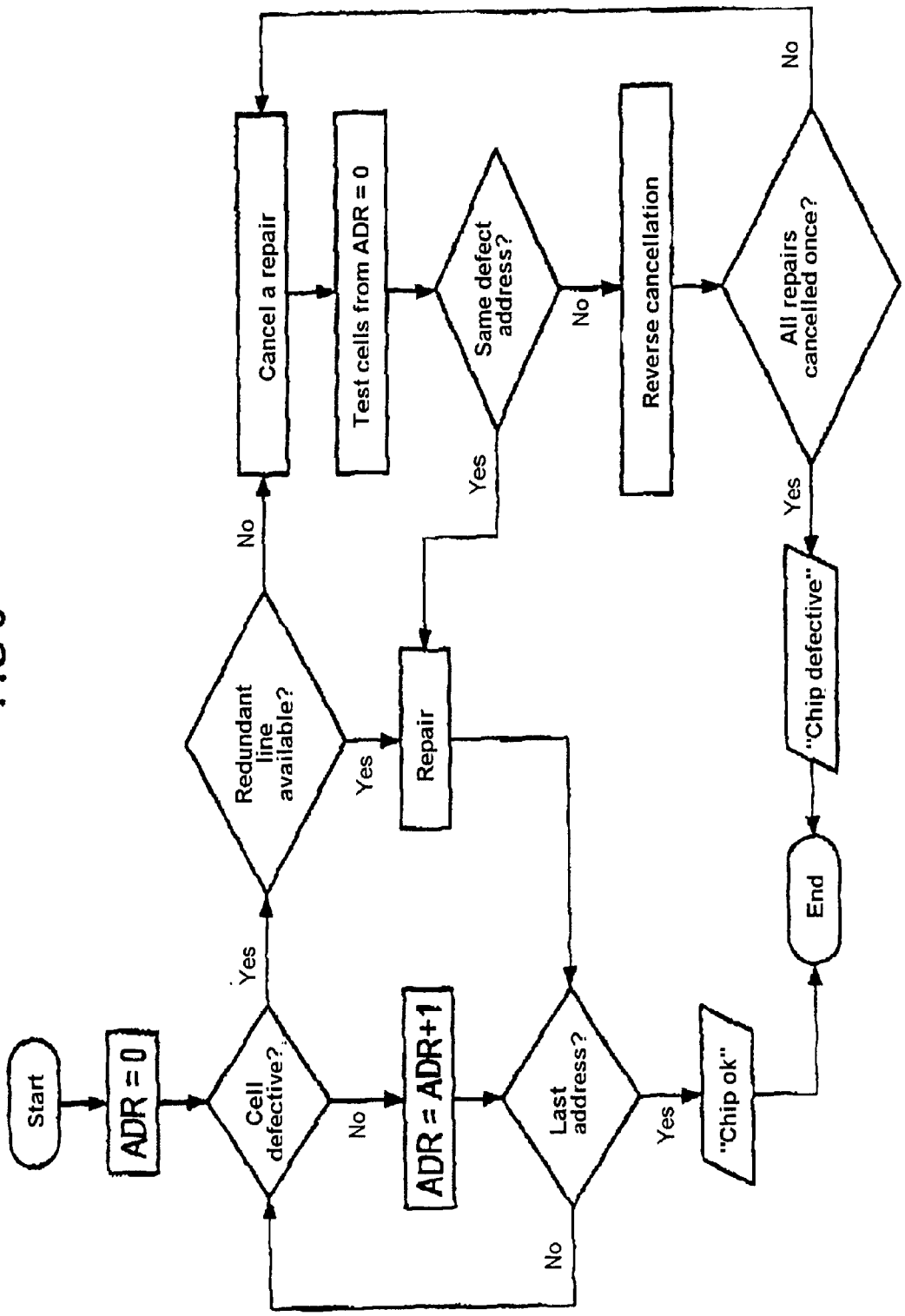
FIG. 3 is a flowchart illustrating a second embodiment of the repair method.
Figure 4:
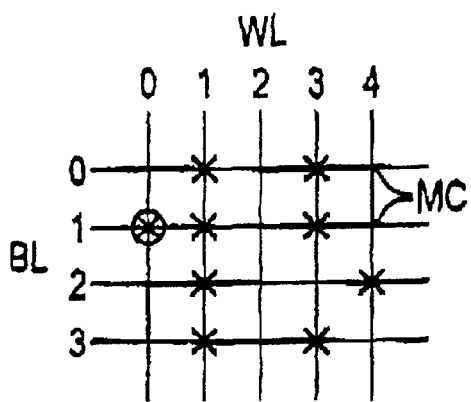
FIGS. 4 to 10 are diagrammatic plan views and related tabular layouts showing an exemplary embodiment for carrying out the repair method of FIG. 3.

Referring now to the figures of the drawing in detail and first, particularly, to FIG. 1 thereof, the memory cells of the integrated memory are successively tested. To test the next memory cell in each case, the address is correspondingly incremented. With each beginning of the testing of a new row line, a counter X is set to zero. If a defect is detected, the counter X is incremented by one and the count of the counter X is compared with a limit value Y. The limit value Y applies to the number of maximum column lines permitted and programmed for the repair in the current row line. This is because the memory cells are tested row by row whereas the repair is carried out column by column when a defect is found. As long as the counter X does not exceed the limit value Y when a defect is found, the defect is eliminated by a redundant column line. If, however, the counter X exceeds the limit value Y, the programming of the redundant column lines which have been programmed for the repair of defects detected in the current row line is canceled. After that, the current row line is repaired by a redundant row line.

It is particularly advantageous if the redundant row line acting as replacement itself is checked for errors after the replacement. For this purpose, the repair method is continued with the check of the memory cell of the redundant row line which has the lowest column address. If errors are detected on the redundant row line, a repair is initially effected via the redundant column lines as before. If their number exceeds the permissible limit value, their programming is canceled and the redundant row line is replaced by another redundant row line. Naturally, the checking of the memory cells of a programmed redundant row line can be omitted if the redundant lines have been tested before they were programmed and only error-free redundant lines are subsequently used for a repair.

Figure 11:
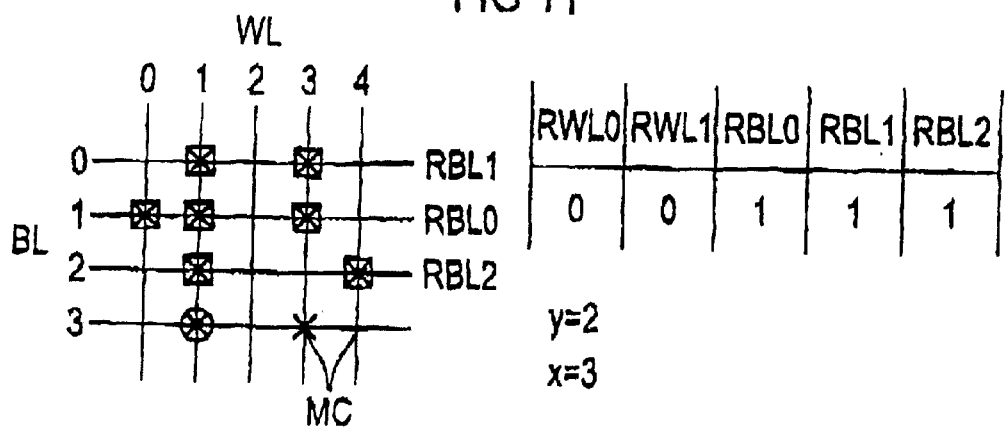
FIGS. 11 and 12 are diagrammatic plan views and related tabular layouts of an exemplary embodiment of the execution of the repair method illustrated in FIG. 1.
Figure 12:
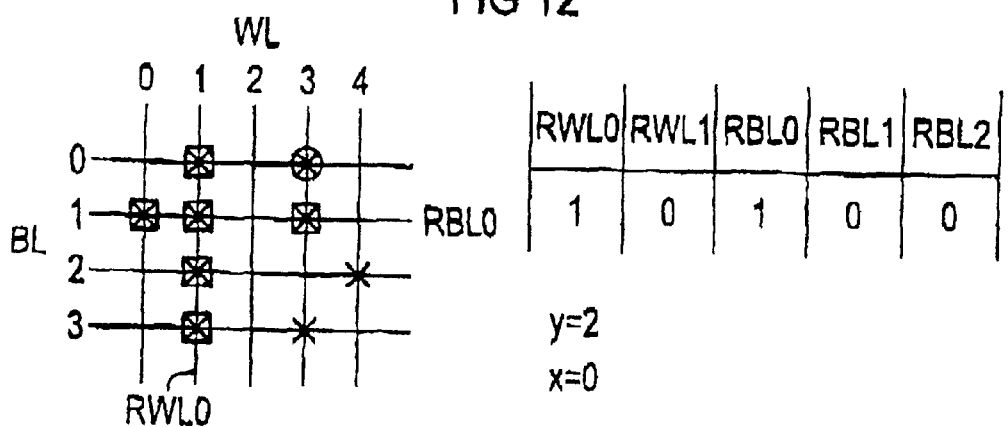

An exemplary embodiment of the first embodiment of the repair method according to the invention will be explained with reference to FIGS. 11 and 12 in the text which follows. In FIG. 11, a memory cell array of the integrated memory is shown in the left-hand part and an overview of the redundant lines is shown in the right-hand part. FIGS. 11 and 12 and 4 to 10 essentially use the same type of representation which is why this will only be discussed once. The memory cells MC of the integrated memory are arranged at cross points of bit lines BL and word lines WL. The bit lines BL are numbered through from 0 to 3 and the word lines WL are numbered through from 0 to 4. Defective memory cells MC are marked by crosses. Memory cells MC already repaired by redundant lines are marked by squares. A circle marks the current defect, that is to say one that has just been found, of the memory cells MC. In the right-hand part of FIG. 11, a table is shown which contains all available redundant lines of the memory as an illustration. In the exemplary embodiment explained with reference to FIGS. 11 and 12, the memory has two redundant word lines RWL0, RWL1 and three redundant bit lines RBL0, RBL1, RBL2. The table specifies which of these redundant lines has already been programmed for replacing one of the normal lines BL, WL. A zero means that the associated redundant line has not yet been programmed and a one means that programming has already taken place.

The left-hand part of FIG. 11 also shows the manner in which the defective memory cells MC have been repaired. To the right of the memory cell array, the redundant bit lines RBLi programmed for replacing the respective normal bit lines BL have been entered and below the memory cell array, the redundant word lines RWLi programmed for replacing the normal word lines are entered. In the present case, a sequential test of the memory cells MC has already taken place before the state shown in FIG. 11, beginning with memory cell address 0,0 (that is to say word line WL0 and bit line BL0) in the direction of the word lines WL. Memory cell 0,0 does not exhibit a defect. After that, memory cell 0,1 was tested (word line WL0, bit line BL1) and a defect was found. This defect was repaired by replacing the bit line 1 with the redundant bit line RLB0. After that, testing of the memory cells continued and, at the beginning of the next word line WL1, the error counter X was reset to zero. The defective memory cell 1,0 on word line WL1 was repaired by the redundant bit line RBL1 and the error counter X was incremented to the value 1. Since bit line BL1 has already been replaced by the redundant bit line RBL0, the next error found is the one having the address 1,2. This is repaired by means of the redundant bit line RBL2. The error counter X is incremented to 2. Next, the defect of memory cell 1,3 is found. This state is shown in FIG. 11. This defect is not repaired by means of a redundant bit line since the error counter X is increased to three and has thus exceeded the limit value Y which also has a value two. In consequence, the programming of the redundant bit lines RBL1 and RBL2 which have been found at addresses 1,0 and 1,2 on the basis of the defects found in the current word line WL1, is canceled. In contrast, the programming of the redundant bit line RBL0 which replaces the normal bit line BL1 is not canceled since it did not take place due to a defect detected in the current word line WL1. Its programming took place on the basis of the defect with address 0,1, found in the word line WL0. After that, the normal word line WL1 is replaced by the redundant word line RWL0.

FIG. 12 shows this state of the integrated memory. The limit value Y is again set to the value 2 since two of the redundant bit lines RBLi are again available for programming. These are redundant bit lines RBL1 and RBL2, the programming of which has been canceled as has just been described. The memory cells are continuously tested so that next the defect having address 3,0 is detected. This is again repaired by means of one of the redundant bit lines RBLi. The repair method is analogously continued, the programming of some of the redundant bit lines being canceled whenever the count of counter X exceeds the limit value Y.

If the number of available redundant bit lines RBLi not yet programmed changes, the limit value Y is newly established at the beginning of the testing of the next word line WLi. In FIG. 2, a supplement to the flowchart of FIG. 1 can be found at the point designated by A and B, according to which the limit value Y is adapted, for example, if the number of redundant column lines already programmed exceeds a value Z. In this case, only a relatively small number of redundant column lines is now available for programming so that the limit value Y must be reduced to a value Y'.

FIG. 3 shows the flowchart for a second embodiment of the repair method according to the invention. The memory cells are tested sequentially, beginning with an address ADR=0. As long as no fault is found, the address is continuously incremented. When the last address has been reached and no defect remains as unrepairable, the integrated circuit is considered to be repaired and the repair method is terminated. As soon as a defective memory cell has been found, the defect is repaired by replacing the row line affected, or the column line affected, by means of a corresponding redundant line as long as a redundant line is still available for programming. If, however, all redundant lines have already been programmed, the programming of one of the redundant lines is canceled so that the original, normal column or row line, respectively, is addressed again. After that, all memory cells are again sequentially tested beginning with start address ADR=0. If then no defect is found, the address of which is before the defect last found, it is certain that the defects repaired by the redundant line, the programming of which has been canceled, have also been repaired by other redundant lines (that is to say several times). The redundant line which has become available can therefore be used for repairing the defect last found. If, however, a defect having a lower address than that of the defect last found is found, the canceling of the programming of the redundant line affected is reversed. This means that it is newly programmed in exactly the same manner as was the case before the cancellation of its programming. This redundant line can thus not be used for repairing the current defect. Instead, the programming of another one of the redundant lines is canceled and the cells are tested again. This method is repeated until the cancellation of the programming of one of the redundant lines is successful or until the programming of all redundant lines has been successively canceled without having been able to repair the current defect. In the latter case, the chip is marked as defective and the repair method is terminated.

In the text which follows, an actual exemplary embodiment of the repair method shown in FIG. 3 is described with reference to FIGS. 4 to 10. In this exemplary embodiment, the integrated memory has two redundant word lines RWL0, RWL1 and two redundant bit lines RBL0, RBL1. Defective memory cells MC are again identified by crosses in the memory cell array. A circle identifies the current defect found. In this exemplary embodiment the repair of known defects is effected by programming the redundant lines in the order shown in the table in the right-hand part of the figures. To repair the first defect having address 0,1 (word line WL0, bit line BL1), the redundant word line RWL0 is, therefore, used. A pointer P points to the redundant line which is to be used next in each case.

Figure 5:
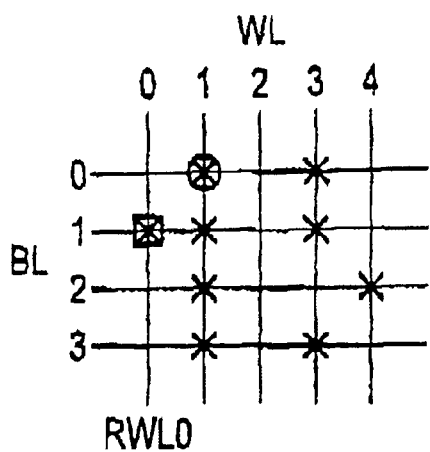
Figure 6:
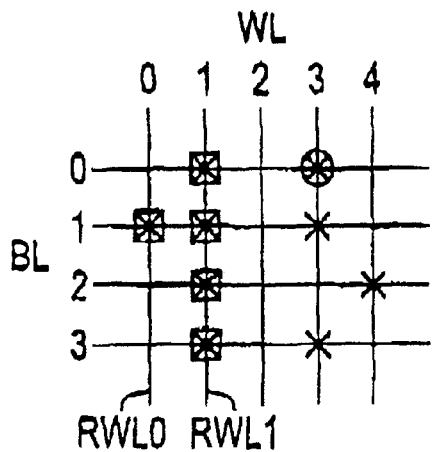

FIG. 5 shows the integrated memory after word line WL0 has been replaced by redundant word line RBL0 with respect to the address. The programming of the redundant word line RWL0 which has taken place is marked by a 1 in the table. The pointer P points to the redundant line RWL1 to be programmed next. Testing of the memory cells is sequentially continued and the defect of memory cell 1,0 is found next. According to FIG. 6, this defect is repaired by programming the redundant word line RWL1. During this process, the other defects on word line WL1 are also repaired automatically without this having to be tested. It is assumed here that the programmed redundant lines are in each case free of errors. This can be detected by a test performed before they are programmed. Only the redundant lines found to be free of errors during this process are used for a repair.

Figure 7:
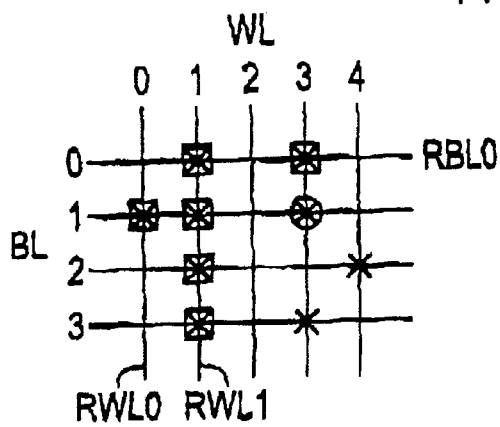
Figure 8:
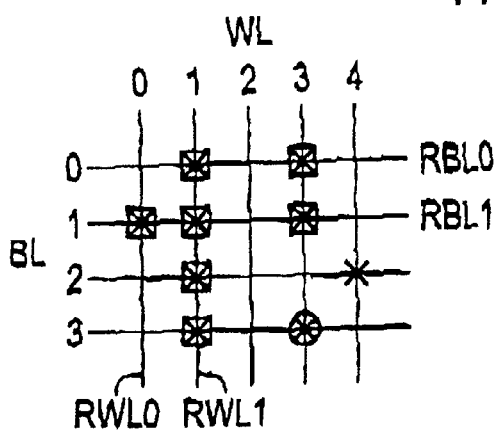

Since the next word line WL2 does not have a defect, the next defect found is the one having address 3,0. In the meantime, the pointer P points to the third redundant line RBL0 so that the current defect is replaced by redundant bit line RBL0. This is shown in FIG. 7. According to FIG. 8, the next defect having address 3,1 is replaced by redundant bit line RBL1.

Figure 9:
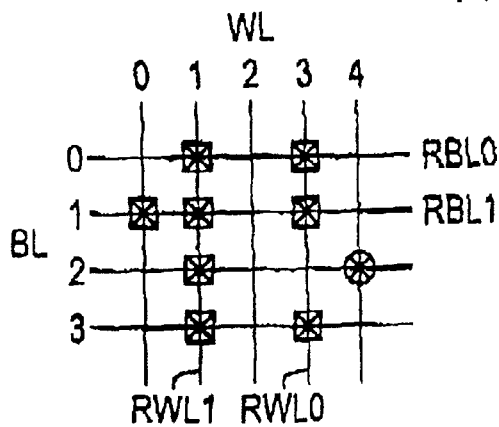

The next defect found and having address 3,3 can now no longer be repaired without problems since all redundant lines have already been programmed and the pointer P again points to the first redundant line RWL0. In this exemplary embodiment, the programming of the redundant line to which pointer P points (this is redundant line RBL0 which was programmed first) is now canceled. Since the only defect which has hitherto been repaired by the redundant word line RWL0 is the one having address 0,1 and this defect has also been eliminated by the programming of the redundant bit line RBL1, no defect having an address which is arranged before the current defect having address 3,3 is found during the subsequent test of all memory cells. The redundant word line RWL0 which has become available due to the cancellation of its programming is, therefore, used for repairing the defect of memory cell 3,3. This state is shown in FIG. 9. Pointer P advances to the next redundant line. The memory test is continued with the memory cells MC not yet tested and the defect having address 4,2 is found. The programming of the redundant word line RWL1, to which pointer P is pointing, is subsequently canceled. The memory cells are again tested beginning at address 0,0, the defect having address 1,2 being found first. Its address is smaller than address 4,2 of the current defect. The cancellation of the programming of the redundant word line RWL1 is, therefore, reversed again.

Figure 10:
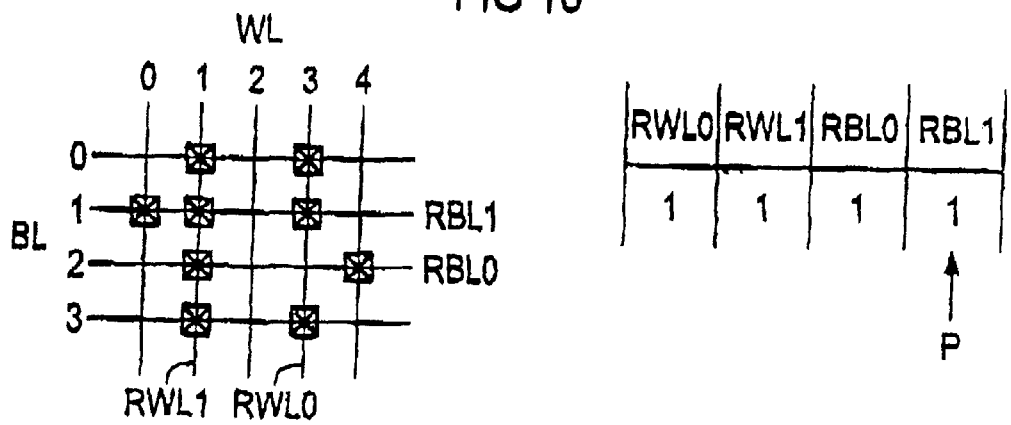

The pointer advances to the next redundant line RBL0 (FIG. 10). Since the current defect having address 4,2 has still not been repaired, the programming of this redundant line RBL0 is now canceled. The memory cells are tested again beginning at start address 0,0. During this testing, no defect is found which is before the current defect having address 4,2. The reason for this is that the defects having addresses 1,0 and 3,0 have already been repaired by the redundant word lines RBL1 and RWL0. The redundant bit line RBL0 which has become available can thus be programmed for repairing the current defect. This state is shown in FIG. 10. The pointer P advances to the next programmed redundant line RBL1. Lastly, the memory cell having address 4,3 is also tested and does not exhibit a defect. The repair method is thus concluded with an integrated memory which is completely repaired.

We claim:

1. A method of repairing defective memory cells of an integrated memory, which comprises:

providing an integrated memory with memory cells arranged at cross points of row lines and column lines and reversibly programmable redundant lines including redundant row lines and redundant column lines;

successively testing the memory cells;

immediately upon detecting a defect of a memory cell being tested, replacing the respectively affected row line or column line by programming one of the redundant lines;

after a certain number of the redundant lines have been programmed, canceling a programming of a given one of the redundant lines upon detecting a further defect; and programming the given redundant line for repairing a defect of another memory cell.

2. The method according to claim 1, which comprises:

testing the memory cells for defects row by row;

upon finding a defect of the memory cell being tested, replacing the affected column line with one of the redundant column lines if a number of the programmed redundant column lines does not exceed a threshold value;

if the threshold value is exceeded, canceling any programming of redundant column lines which has taken place due to defects having been found in the affected row line; and replacing the affected row line by one of the redundant row lines.

3. The method according to claim 2, which comprises changing the threshold value during the testing.

4. The method according to claim 1, which comprises:

testing the memory cells, beginning at a start address;

once all redundant lines have been programmed, canceling the programming of one of the redundant lines if a further defect is found;

retesting the memory cells, beginning at the start address;

if, during the retesting step, a defect is found, with an address before the further defect, reversing the canceling of the programming of the corresponding redundant line;

subsequently repeating the preceding testing, canceling, and retesting method steps;

if, after canceling the programming of one of the redundant lines, during the subsequent testing of the memory cells, no defect is found with an address before the further defect, repairing the further defect with the redundant line that has become available due to the canceling of its programming.

5. The method according to claim 4, which comprises marking the memory unrepairable if, after the further defect has been found, the successive canceling of the programming of all redundant lines does not provide for a repair of all the detected defects.

* * * * *